(12) United States Patent
Khalil et al.

(10) Patent No.: US 8,005,990 B2
(45) Date of Patent: Aug. 23, 2011

(54) EFFICIENT DECODING OF MOBILE MULTIMEDIA MULTICAST SYSTEM NON REAL-TIME SERVICE FILES

(75) Inventors: Ahmed Khalil, Cairo (EG); Nabil Yousef, Foothill Ranch, CA (US)

(73) Assignee: Newport Media, Inc., Lake Forest, CA (US)

( * ) Notice: Subject to any disclaimer, the term of this patent is extended or adjusted under 35 U.S.C. 154(b) by 798 days.

(21) Appl. No.: 12/039,820

(22) Filed: Feb. 29, 2008

(65) Prior Publication Data

US 2009/0222585 A1    Sep. 3, 2009

(51) Int. Cl.
*G06F 15/16*    (2006.01)
*H03M 7/00*    (2006.01)

(52) U.S. Cl. ............................ 709/247; 709/246; 341/50

(58) Field of Classification Search .................. 709/230, 709/246, 247; 341/50; 375/240, 240.01
See application file for complete search history.

(56) References Cited

U.S. PATENT DOCUMENTS

| | | | | |
|---|---|---|---|---|
| 5,617,541 | A * | 4/1997 | Albanese et al. | 709/207 |
| 6,460,086 | B1 * | 10/2002 | Swaminathan et al. | 709/236 |
| 7,376,885 | B2 * | 5/2008 | Richardson et al. | 714/758 |

OTHER PUBLICATIONS

Lauritzen, et al., "Local Computations with Probabilities on Graphical Structures and Their Application to expert Systems," Journal of the Royal Statistical Society, Series B, vol. 50, No. 2, 1988, pp. 157-224.
TIA-1099, "Forward Link Only Air Interface Specification for Terrestrial Mobile Multimedia Multicast," Telecommunications Industry Association, Aug. 2006, pp. 1-168.

* cited by examiner

*Primary Examiner* — Brian J Gillis
(74) *Attorney, Agent, or Firm* — Rahman LLC

(57) ABSTRACT

A technique for decoding code packets of file delivery protocol (FDP) and file delivery control protocol (FDCP) messages, the FDP messages comprising fields having values used to generate an indices of a data packets, the FDCP messages comprising a value of a minimum number of code packets required, the code packets formed from a linear combination of the data packets of a file fragment, the method includes constructing data structures adapted to decode the code packets of the file fragment, the data structures comprising at least one of code nodes, a code graph, an inverse code graph, a data packet decode array, and a data packet decode order list, processing the FDP messages until a parameters required for decoding are extracted, and populating the inverse code graph with a reference to the code node.

20 Claims, 15 Drawing Sheets

EFFICIENT DECODING OF MOBILE MULTIMEDIA MULTICAST SYSTEM NON REAL-TIME SERVICE FILES

BACKGROUND

1. Technical Field

The embodiments herein generally relate to decoding techniques, and, more particularly, to efficient decoding of MediaFLO™ system non real-time service files.

2. Description of the Related Art

MediaFLO™ (Forward Link Only) mobile multimedia multicast system, available from Qualcomm, Inc., California, USA, is a technology used for broadcast data to portable devices. The MediaFLO™ system technology transmits data on a frequency separate from the frequencies used by current cellular networks. The FLO system is a one-way data transmission path from a tower to the device. Non real-time service delivers content to the device in files which contain media clips (e.g., of audio and video) and other type of data which are stored in the device for later retrieval. The delivery of MediaFLO™ system non real-time service files in portable devices such as a cell phone, personal display assistant (PDA), and mobile television (TV) is performed specifically by two protocols: file delivery protocol (FDP) and file delivery control protocol (FDCP).

Files are subjected to message coding to ensure that they are delivered efficiently to the devices. The file delivery protocol (FDP) delivers file data and is responsible for the delivery of encoded packets. The FDP defines file delivery message (FDM) that is used to deliver encoded packets. FDCP delivers control information related to the file delivery. FDCP delivers messages which specify file delivery parameters that are common to a file delivery session. The FLO channel exposes the transmitted data to random noise and fading. The FDP and FDCP protocols recover any loss of data by channel erasure coding.

An erasure code is used to recover original message from an encoded data. An erasure code encodes data so that the original message can be decoded without receiving all the encoded data (e.g., it transforms a message of n blocks into a message with more than n blocks, such that the original message is recovered from a subset of those blocks). The decoding process on the device side is performed by collecting FDP code packets and recovering the data packets by inverting the encoding process and solving a linear system of equations. The recovery of all the data packets code using the decoding process is performed successfully by reducing code nodes in the file fragment.

A code node holds information of the data indices of the data packets used to generate it. The reducibility of code nodes is determined by the Lauritzen/Spiegelhalter Belief Propagation Algorithm. The algorithm solves the so-called "counting it twice" problem. This algorithm can be performed by either upward pass or downward pass. In the upward pass, each node, when sending a message, divides its table by that message, the division is cancelled out when the message eventually returns. Messages are not stored, tables are updated. Each node waits to send its message to its nearest neighbor r until it has received messages from all its other neighbors.

In the downward pass, each node waits to send its message to a particular neighbor outward from r until it has received messages from all its other neighbors. The decoding process imposes a big impact on the device working memory, file storage and computational power. Handheld mobile devices are characterized by low availability of memory resources, low computational power, and slow file storage access. In order to optimize the use of working memory, storage access and to minimize the steps to recover the data packets successfully from the code packets, there is a need for an efficient decoding algorithm.

SUMMARY

In view of the foregoing, an embodiment herein provides a method of decoding code packets of FDP and FDCP messages, the FDP messages comprising fields having values used to generate an indices of a data packets, the FDCP messages comprising a value of a minimum number of code packets required, the code packets formed from a linear combination of the data packets of a file fragment, the method includes constructing data structures adapted to decode the code packets of the file fragment, the data structures comprising at least one of code nodes, a code graph, an inverse code graph, a data packet decode array, and a data packet decode order list, processing the FDP messages until a parameters required for decoding are extracted, the processing includes inserting the code node into a code graph bin of the code graph corresponding to weights of the code graph bin only if an FDP message corresponding to the code node is unique, populating the inverse code graph with a reference to the code node, and executing a solvability algorithm when a number of received code packets reaches the minimum number of code packets required.

The solvability algorithm may include the code graph bins having code nodes starting with a code graph bin having lowest code weight may be traversed, the code graph bins are arranged in an ascending order of code weights, if a corresponding code packet of each code node in a list connected to each of the code graph bins can be reduced further using a data packet associated with the code packet may be determined, if the code packet cannot be reduced further it may be proceeded to a next code node in the list, and a cost value of the code packet may be incremented by a cost value associated with the data packet used to reduce the code packet.

The parameters required for decoding may include at least one of a minimum number of the code packets to decode successfully with high probability, a field in the FDP message containing specific values to generate data packet indices, a file fragment ID to determine which file fragment the received FDP packet belongs to, and a file distribution record comprising at least one of an offset of the fragment in a file, a size of the file fragment, and a code weight map. The FDP message may correspond to the code node determined to be unique based on at least one of a data index, a code weight index, and a prime index which have not been already received.

The solvability algorithm may further include the data packet decode array which is indexed using an index of a recovered data packet, and a code packet storage access information, a code node reference, a data packet cost, and a reference of a decode order may be updated in the data packet decode order list, if a data packet is recovered from the code packet. The solvability algorithm may further include a corresponding entry in the data packet decode array which is replaced by an information of a code packet from which the data packet is recovered, and the reference which is updated in the data packet decode order list to reflect a new decode order, if a cost associated with the code packet is less than a cost associated with the corresponding entry in the data packet decode array.

The method may further include a decode failure which may be indicated for a file reception condition if an end of a contact window is reached and no more code packets are received. The method may further include a code packet payload reduction algorithm which may be executed to reduce the stored code packet payload using an information in the data packet decode array and the inverse code graph if the solvability algorithm is successful, the code packet payload reduction algorithm may further include an inverse code graph which may be indexed with the index of a first data packet to be recovered using the data packet decode order list, a code packet payload may be obtained from the inverse code graph, a next entry index may be fetched from the data packet decode order list, the inverse code graph repeatedly indexed with the index of a first data packet to be recovered using the data packet decode order list, and the inverse code graph repeatedly indexed with the index of a first data packet to be recovered using the data packet decode order list until the data packet decode order list is completely processed and all data packets have been fully recovered.

In another aspect, a computer readable medium having stored thereon data structures adapted to decode a FDP packet of a file fragment, the data structures includes a code node to store an information for retrieving a payload of the FDP packet, the code node adapted to indicate if its corresponding code packet can be further reduced, a code graph comprising bins corresponding to a code weight, the bins comprising code nodes with the code weight, an inverse code graph array having a number of elements equivalent to a number of data packets in the file fragment, a data packet decode array adapted to check whether all the data packets can be decoded successfully, and a data packet decode order list to store an order in which the data packets are recovered.

The bins may be arranged in order based on the code weights. The inverse code graph may be indexed by an index of the data packets. The data packet decode array may be indexed by an index of a recovered data packet, if the data packet can be recovered from the code packet, the data packet decode array includes a code packet storage access information, a code node reference, a data packet cost, and a reference of a decode order in the data packet decode order list.

In yet another aspect, an apparatus adapted to decode code packets of FDP and FDCP messages, the FDP messages comprising fields having values used to generate an indices of a data packets, the FDCP messages comprising a value of a minimum number of code packets required, the code packets formed from a linear combination of the data packets of a file fragment, the apparatus includes a memory unit including data structures adapted to decode the code packets of the file fragment, the data structures including at least one of code nodes, a code graph, an inverse code graph, a data packet decode array, and a data packet decode order list, a processor adapted to process the FDP messages until a parameters required for decoding are extracted, the processor includes means for inserting the code node into a code graph bin of the code graph corresponding to weights of the code graph bin only if an FDP message corresponding to the code node is unique, and means for populating the inverse code graph with a reference to the code node, and execute a solvability algorithm when a number of received code packets reaches the minimum number of code packets required.

The solvability algorithm may include the code graph bins having code nodes which may be traversed starting with a code graph bin having lowest code weight, the code graph bins are arranged in an ascending order of code weights, a corresponding code packet of each code node in a list connected to each of the code graph bins which is reduced further using a data packet associated with the code packet may be determined, if the code packet cannot be reduced further it may be proceeded to a next code node in the list, and a cost value of the code packet may be incremented by a cost value associated with the data packet used to reduce the code packet.

The parameters required for decoding may include at least one of a minimum number of the code packets to decode successfully with high probability, a field in the FDP message containing specific values to generate data packet indices, a file fragment ID to determine which file fragment the received FDP packet belongs to, and a file distribution record comprising at least one of an offset of the fragment in a file, a size of the file fragment, and a code weight map. The FDP message may correspond to the code node determined to be unique based on any of whether at least one of a data index, a code weight index, and a prime index have not been already received.

The solvability algorithm may further include the data packet decode array which may be indexed using an index of a recovered data packet, and a code packet storage access information, a code node reference, a data packet cost, and a reference of a decode order which may be updated in the data packet decode order list, if a data packet can be recovered from the code packet. The solvability algorithm may further include a corresponding entry in the data packet decode array which may be replaced by an information of a code packet from which the data packet is recovered, and the reference in the data packet decode order list may be updated to reflect a new decode order, if a cost associated with the code packet is less than a cost associated with the corresponding entry in the data packet decode array.

The processor may further indicate a decode failure for a file reception condition if an end of a contact window is reached and no more code packets are received. The processor may further execute a code packet payload reduction algorithm to reduce the stored code packet payload using an information in the data packet decode array and the inverse code graph if the solvability algorithm is successful, the code packet payload reduction algorithm includes the inverse code graph which may be indexed with the index of a first data packet to be recovered using the data packet decode order list, a code packet payload which may be obtained from the inverse code graph, a next entry index which may be fetched from the data packet decode order list, the inverse code graph which may be repeatedly indexed with the index of a first data packet to be recovered using the data packet decode order list; and the inverse code graph which may be repeatedly indexed with the index of a first data packet to be recovered using the data packet decode order list until the data packet decode order list is completely processed and all data packets have been fully recovered.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
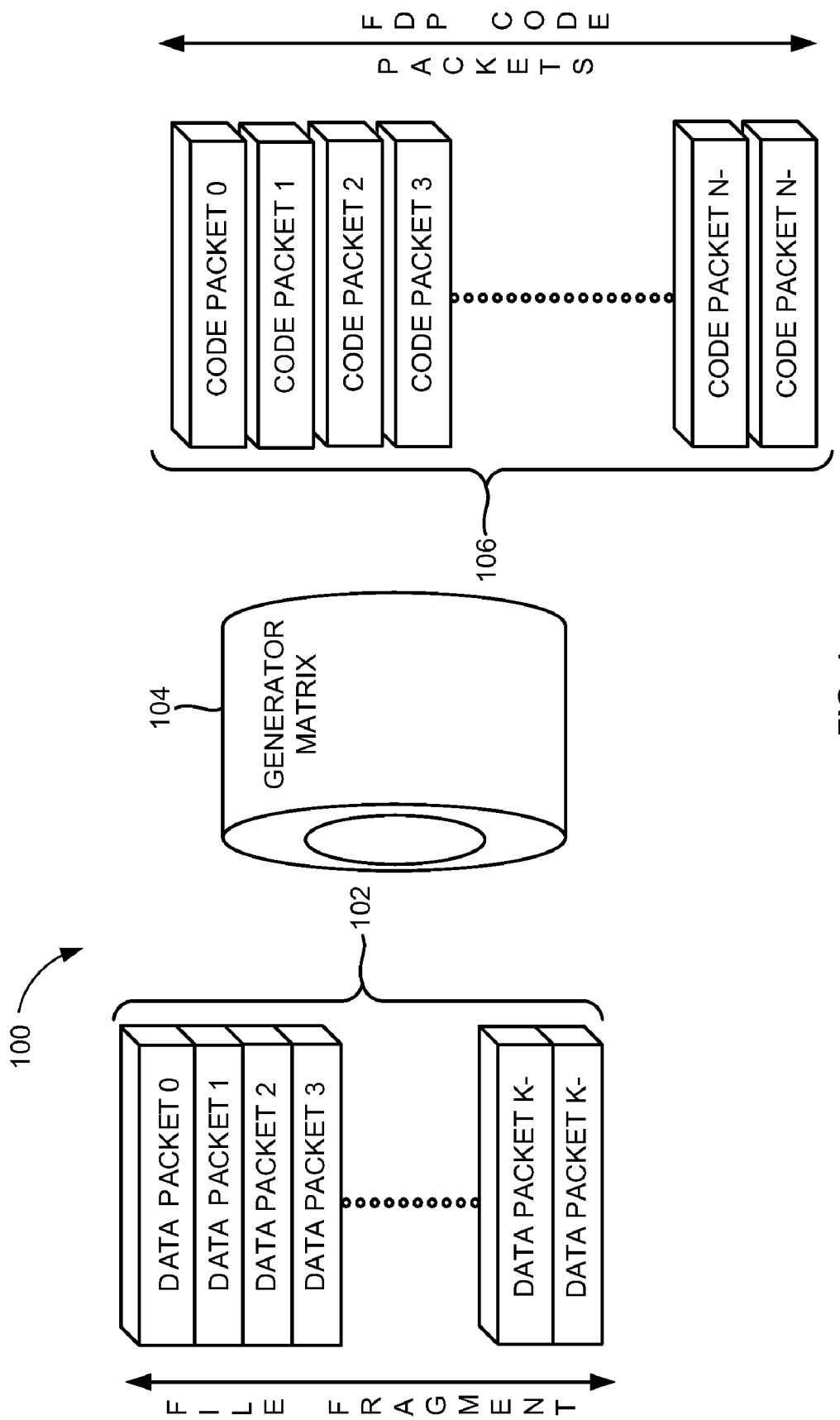
FIG. 1 illustrates a FDP code packets encoding process in a mobile TV FLO system according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a method of decoding code packets of FDP and FDCP messages, the FDP messages comprising fields having values used to generate an indices of a data packets, the FDCP messages comprising a value of a minimum number of code packets 106 required, the code packets 106 formed from a linear combination of the data packets of a file fragment includes constructing data structures adapted to decode the code packets 106 of the file fragment, processing the FDP messages until a parameters required for decoding are extracted, the processing including inserting the code nodes into a code graph bins of the code graph corresponding to a weights of the code graph bins, populating the inverse code graph with a reference to the code nodes, executing a solvability algorithm when a number of received code packets 106 reaches the minimum number of code packets required, the solvability algorithm includes traversing the code graph bins 204 A-H having code nodes starting with a code graph bin having lowest code weight, determining if a corresponding code packet of each code node in a list connected to each of the code graph bins can be reduced further using a data packet associated with the code packet, proceeding to a next code node in the list only if the code packet cannot be reduced further, and incrementing a cost value of the code packet by a cost value associated with the data packet used to reduce the code packet.

The code graph bins are arranged in an ascending order of code weights. The data structures comprise at least one of a code node, a code graph, an inverse code graph, a data packet decode array or a data packet decode order list. Referring now to the drawings, and more particularly to FIGS. 1 through 9, where similar reference characters denote corresponding features consistently throughout the figures, there are shown preferred embodiments.

FIG. 1 illustrates a FDP code packet encoding process 100 in a mobile TV FLO system according to an embodiment herein. FIG. 1 shows file fragment 102, generator matrix 104, and the FDP code packets 106. The file fragment 102 comprises data packets 0-K. The FDP code packets 106 comprise code packets 0-N. The file fragment 102 may be formed by the breakdown of a file-by-file delivery protocol (FDP). The file delivery protocol (FDP) may break each file into several fragments, where each file fragment is broken into data packets 0-K. The generator matrix 104 may multiply the data packets 0-K and generate the code packets 0-N.

Figure 2A:
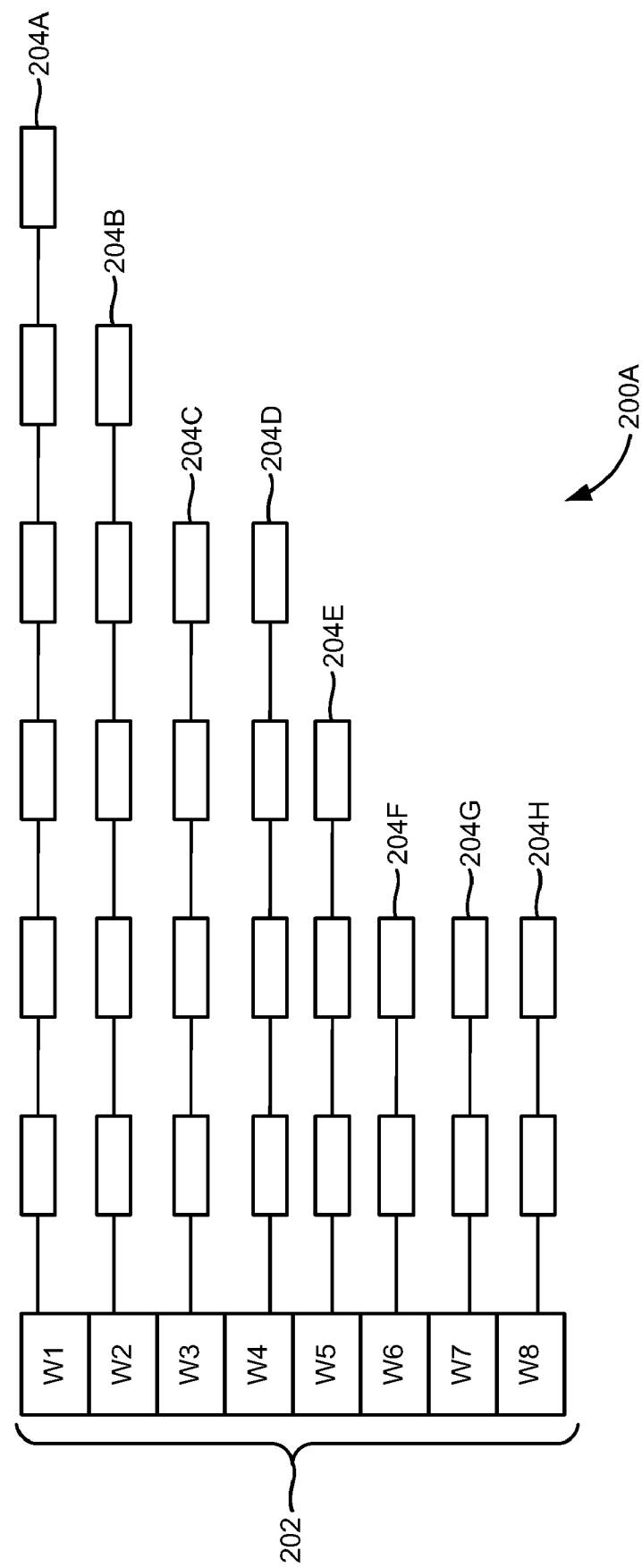
FIGS. 2A through 2D illustrate data structures of a code graph, an inverse code graph, a data packet decode array, and a data packet decode order list of a file fragment according to an embodiment herein.

The code packets 0-N are decoded in the decoding process and again the decoded data packets are recovered by inverting the encoding process and solving the linear system of equations. FIGS. 2A through 2D illustrate data structures of a code graph 200A, an inverse code graph 200B, a data packet decode array 200C, and a data packet decode order list 200D of a file fragment, according to an embodiment herein. FIG. 2A illustrates code weight map 202 and bins 204A-H. The code weight map 202 includes code weights W1-W8. Each bin of the code graph 200A comprises a number of code nodes connected to each other linearly.

Each bin may correspond to one of the code weights W1-W8 in the code weight map 202 and is arranged based on the corresponding code weights of the related file fragment. Each bin acts as a container for code nodes with the same code weight value w. The code nodes holds information such as the data indices of the data packets used to generate FDP code packets 106. The code node indicates if its corresponding code packet can be further reduced. The code nodes also holds information related to retrieving the payload of the FDP code packets 106 from storage.

Figure 2B:
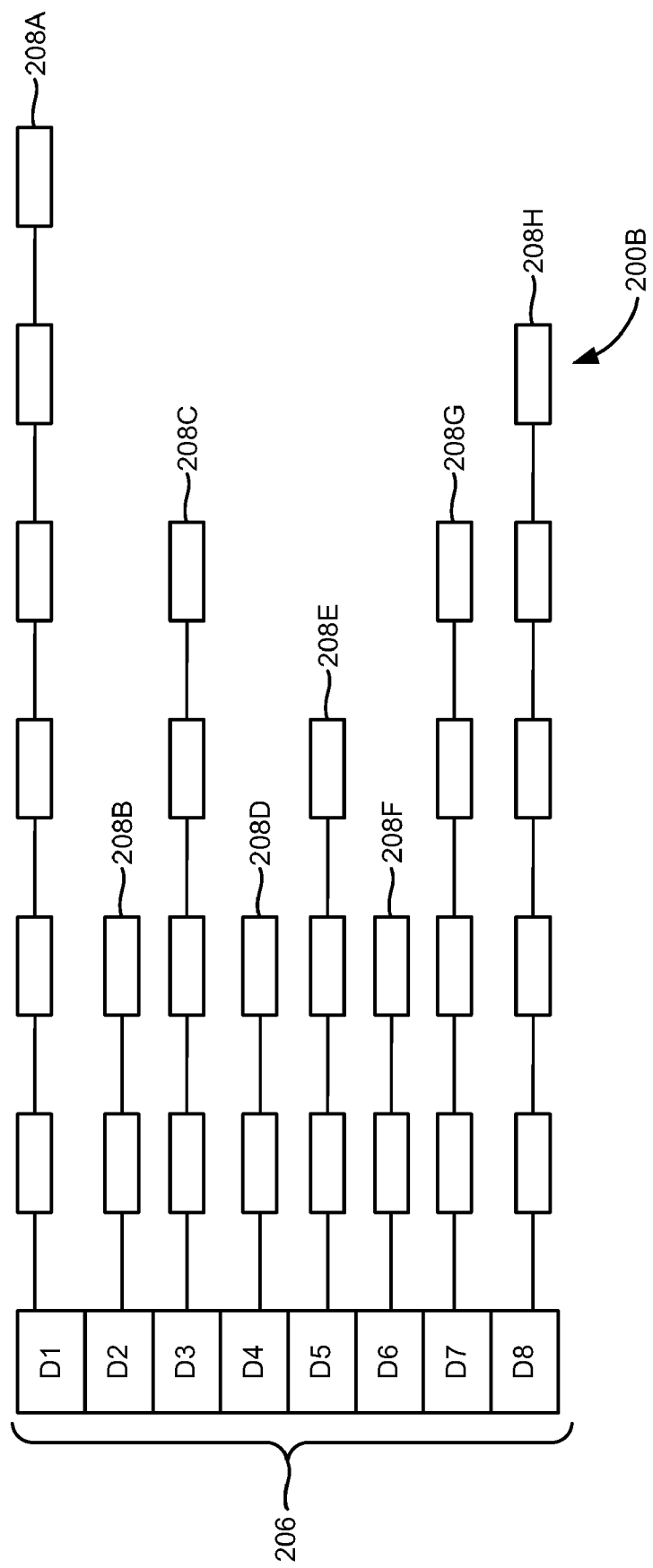

FIG. 2B illustrates an array 206 and bins 208 A-H. The size of the array 206 may be equivalent to the number of data packets in the file fragment 102 of FIG. 1. The array 206 may be indexed by the data packet index. Each array element D1-D8 of the array 206 holds information to the code nodes that the data packet is used to generate. Each bin of the inverse code graph 200B comprises a number of code nodes connected to each other linearly. The inverse code graph 200B may be indexed by an index of data packets. In one embodiment, each bin corresponds to one of the array elements D1-D8. In one embodiment, each bin acts as a container for code nodes. Each code node has a reference associated with it, which is the code node reference.

Figure 2C:
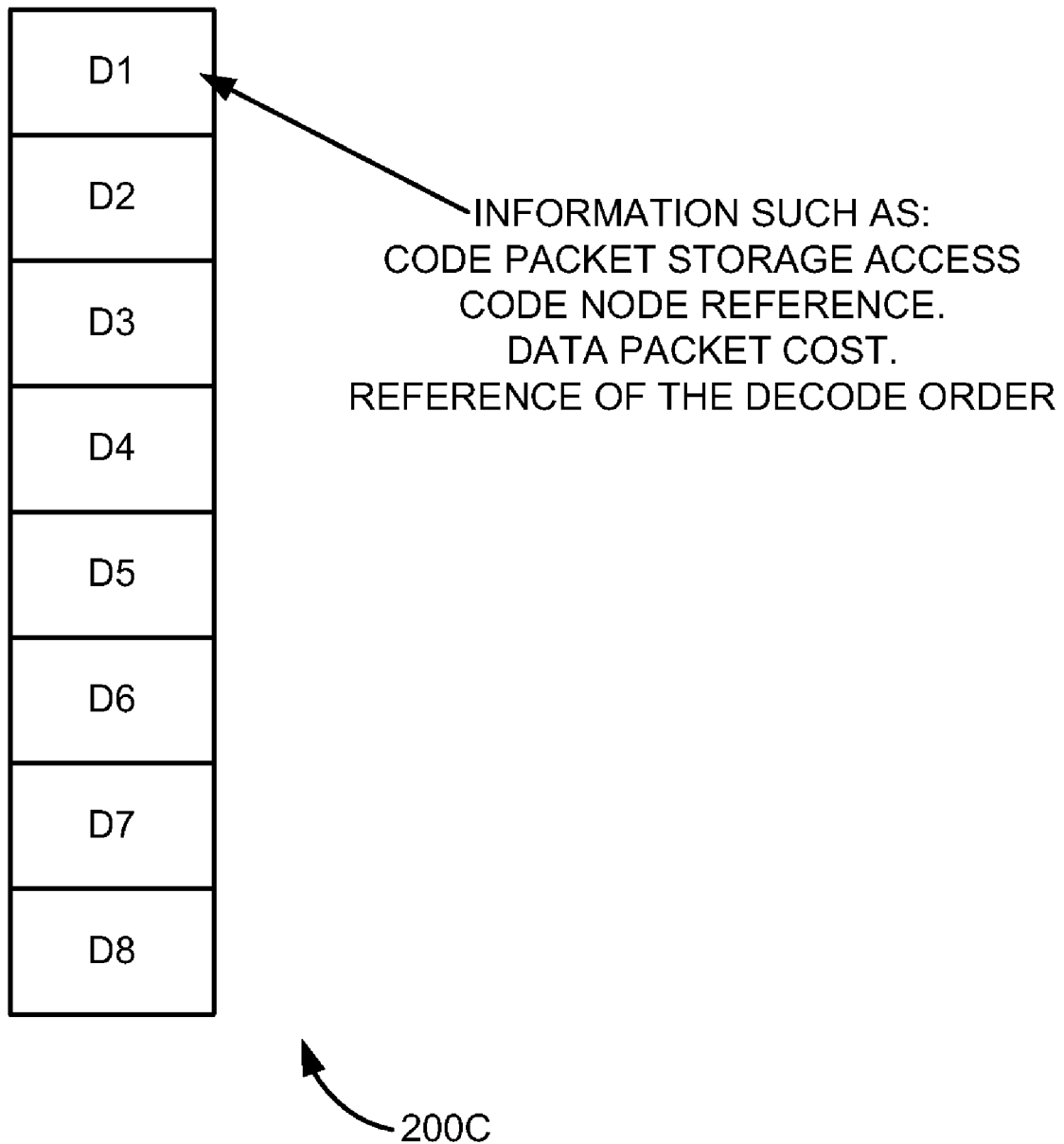
Figure 2D:
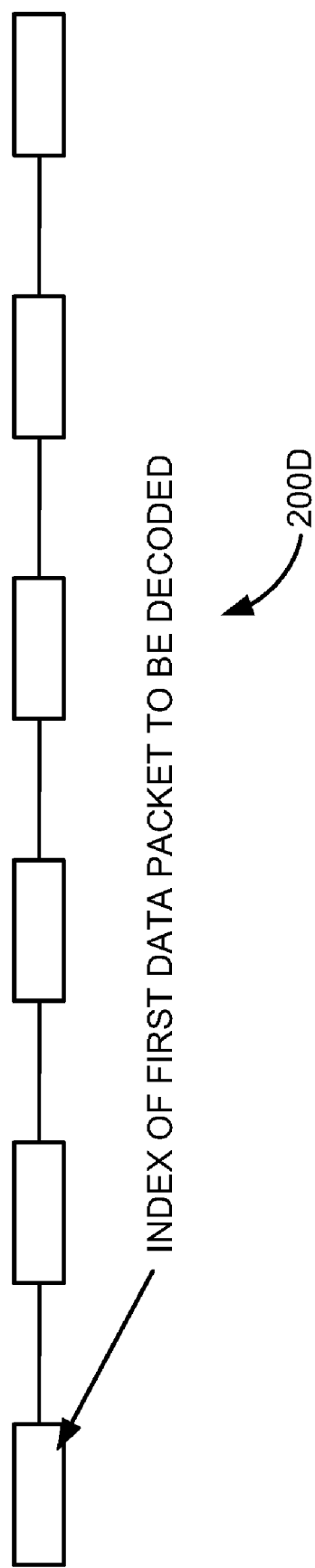

FIG. 2C shows the data packet decode array 200C containing information such as code packet storage access, code node reference, data packet cost, and reference of the decode order in the data packet decode order list. The data packet decode array 200C is indexed by an index of a recovered data packet, if the data packet can be recovered from the code packet. In one embodiment, the data packet decode array 200C is used to determine whether all data packets can be decoded successfully or not during the solvability step. FIG. 2D shows the index of first data packet to be decoded and also the order in which the data packets are to be decoded.

Figure 3A:
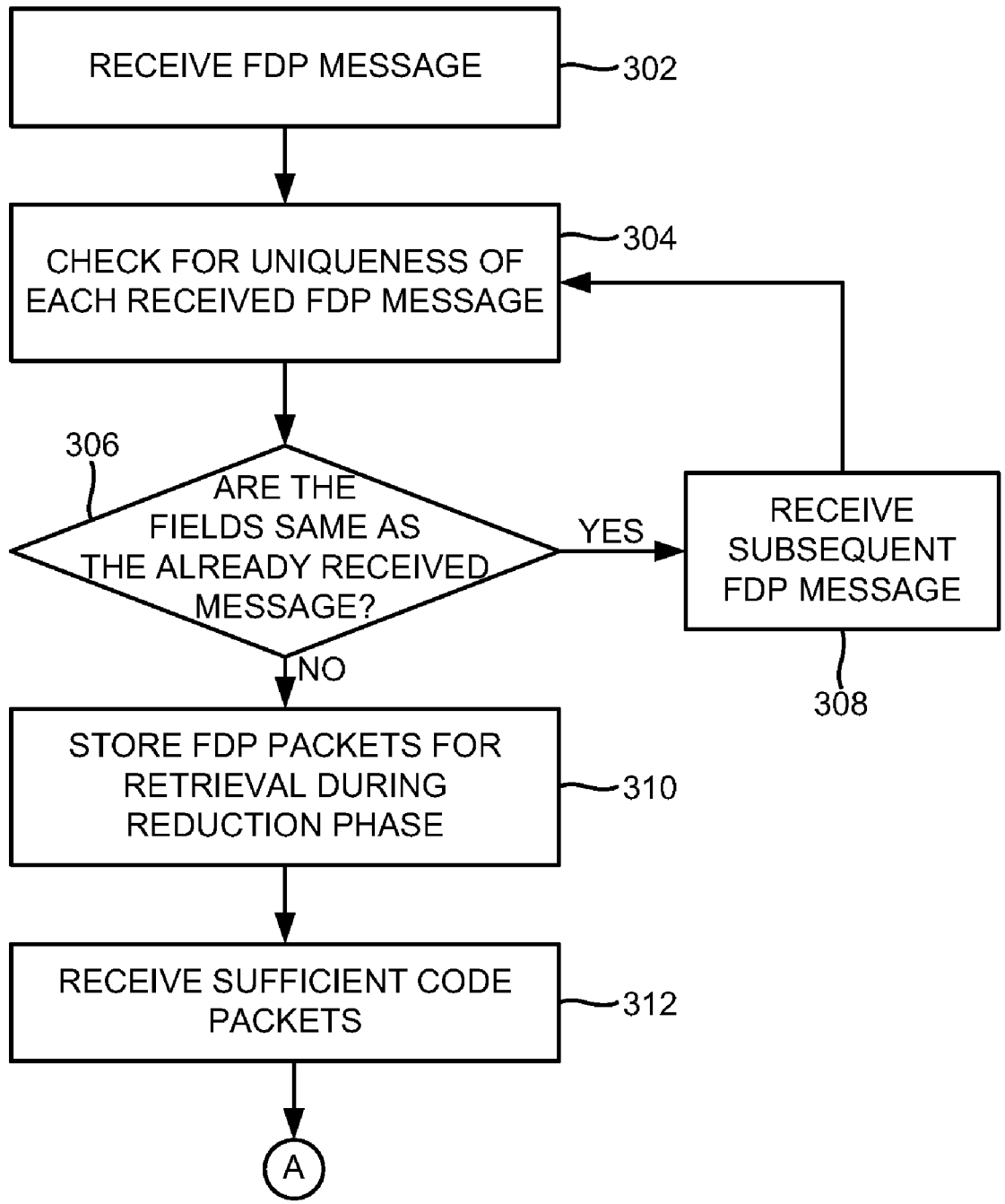
FIGS. 3A through 3B are flow diagrams illustrating a process of decoding code packets and recovering data packets of a file fragment according to an embodiment herein.
Figure 3B:
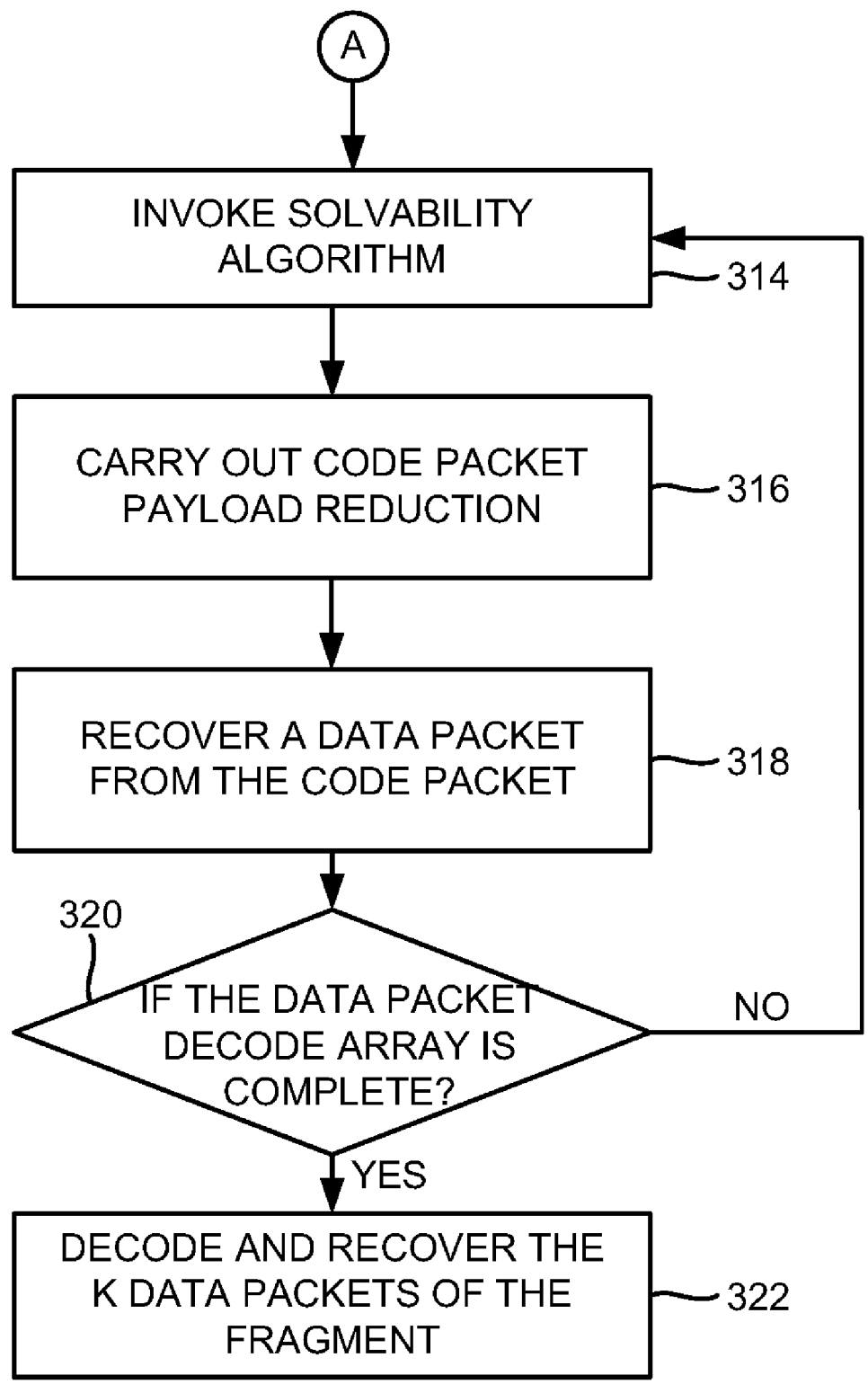

The data packet decode order list 200D is a list which holds the decode order of data packets; i.e., the order of the data packets as they are recovered during the solvability step. FIGS. 3A and 3B are flow diagrams illustrating a process of decoding code packets and recovering data packets of a file fragment according to an embodiment herein. In step 302, an FDP message is received. In step 304, each received FDP message is checked for uniqueness based on whether an FDP message with the same DATA_INDEX, CODE_WEIGHT_INDEX, and PRIME_INDEX have not been already received. In step 306, a condition is checked if the fields are same as the already received message.

The process is jumped to step 308 if the received FDP message is not unique (Yes). The process is jumped to step 310, if the received FDP message is unique in fields (No). In step 308, a subsequent FDP message is received and the step 304 is repeated. In step 310, the FDP code packets are stored on permanent storage. In step 312, sufficient code packets are received for the reduction process. In step 314, a solvability algorithm is invoked. In step 316, code packet payload reduction is carried out. In step 318, data packet is recovered from the code packet. In step 320, a condition is checked if the data packet decode array is complete.

Figure 4:
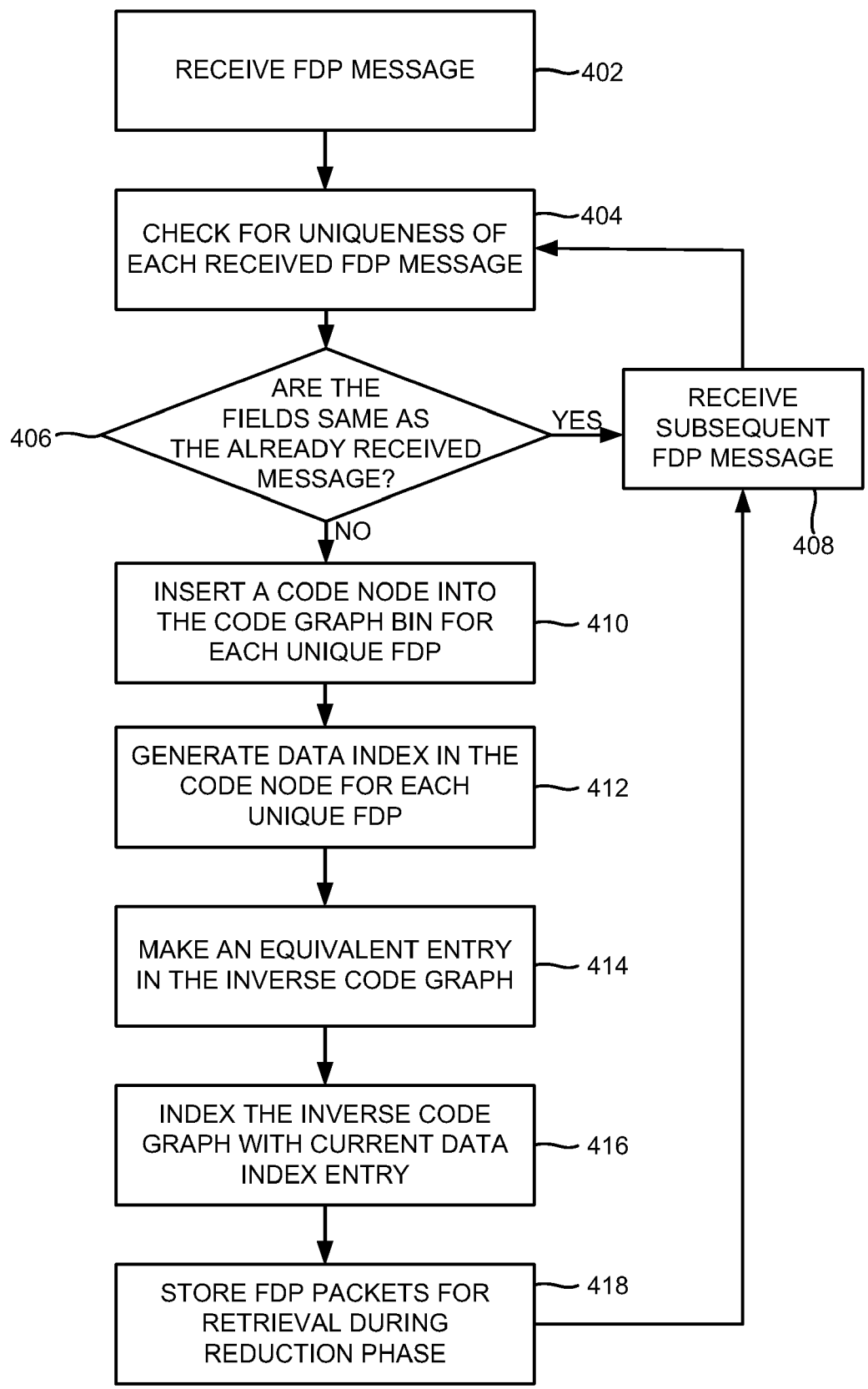
FIG. 4 is a flow diagram illustrating a process of collecting FDP messages according to an embodiment herein.

If the condition is satisfied (Yes), the process proceeds to step 322 and if not (No), it is jumped to step 314 and the process is repeated from step 314. In step 322, the K data packets of the file fragment are decoded and recovered. FIG. 4 is a flow diagram illustrating a process of collecting FDP messages according to an embodiment herein. In step 402, a FDP message is received. In step 404, each received FDP message is checked for uniqueness based on whether an FDP message with the same DATA_INDEX, CODE_WEIGHT_INDEX and PRIME_INDEX have not been already received. In step 406, a condition is checked if the fields are same as the already received message. The process is jumped to step 408 if the received FDP message is not unique (Yes).

The process is jumped to step 410, if the received FDP message is unique (No) in fields. In step 408, a subsequent FDP message is received and the step 404 is repeated. In step 410, a code node is inserted into the code graph bin corresponding to its weight for each unique FDP. In step 412, a data index is generated in the code node for each unique FDP. In step 414, an equivalent entry is made in the inverse code graph. In step 416, the inverse code graph is indexed by the current data index. In one embodiment, the inverse code graph is indexed by the current data index generated and then a reference to the code node is inserted in a list of all code nodes that referenced the current entry in the inverse code graph. In step 418, the FDP code packets are stored on permanent storage for later retrieval during the code packets reduction phase.

Figure 5:
FIG. 5 illustrates a table view of parameters needed for the decoding process according to an embodiment herein.

FIG. 5 illustrates a table view 500 of the parameters needed for the decoding process according to an embodiment herein. The parameters include a MIN_NUMBER_OF_CODE_PACKETS 502, a DATA_INDEX, PRIME_INDEX, and CODE_WEIGHT_INDEX 504, a FILE_FRAGMENT_ID 506, and a FILE_DISTRIBUTION_RECORD 508. The parameter MIN_NUMBER_OF_CODE_PACKETS 502 refers to the minimum number of code packets required to be decoded with high probability and this number is sent within the FDCP message. The DATA_INDEX, PRIME_INDEX, CODE_WEIGHT_INDEX 504 are the fields in the FDP message that contain specific values used to generate the data packet indices. These fields are used for checking the uniqueness of each received FDP message; i.e., an FDP message with the same DATA_INDEX, CODE_WEIGHT_INDEX and PRIME_INDEX that have not been already received as in the step 404 of FIG. 4. The DATA_INDEX, CODE_WEIGHT_INDEX and PRIME_INDEX 404 fields of an FDP message are processed with other parameters; i.e., MIN_NUMBER_OF_CODE_PACKETS 502, FILE_FRAGMENT_ID 506, and FILE_DISTRIBUTION_RECORD 508 to determine the set of data packets used to generate the code packet carried in the payload of this FDP message.

Figure 6A:
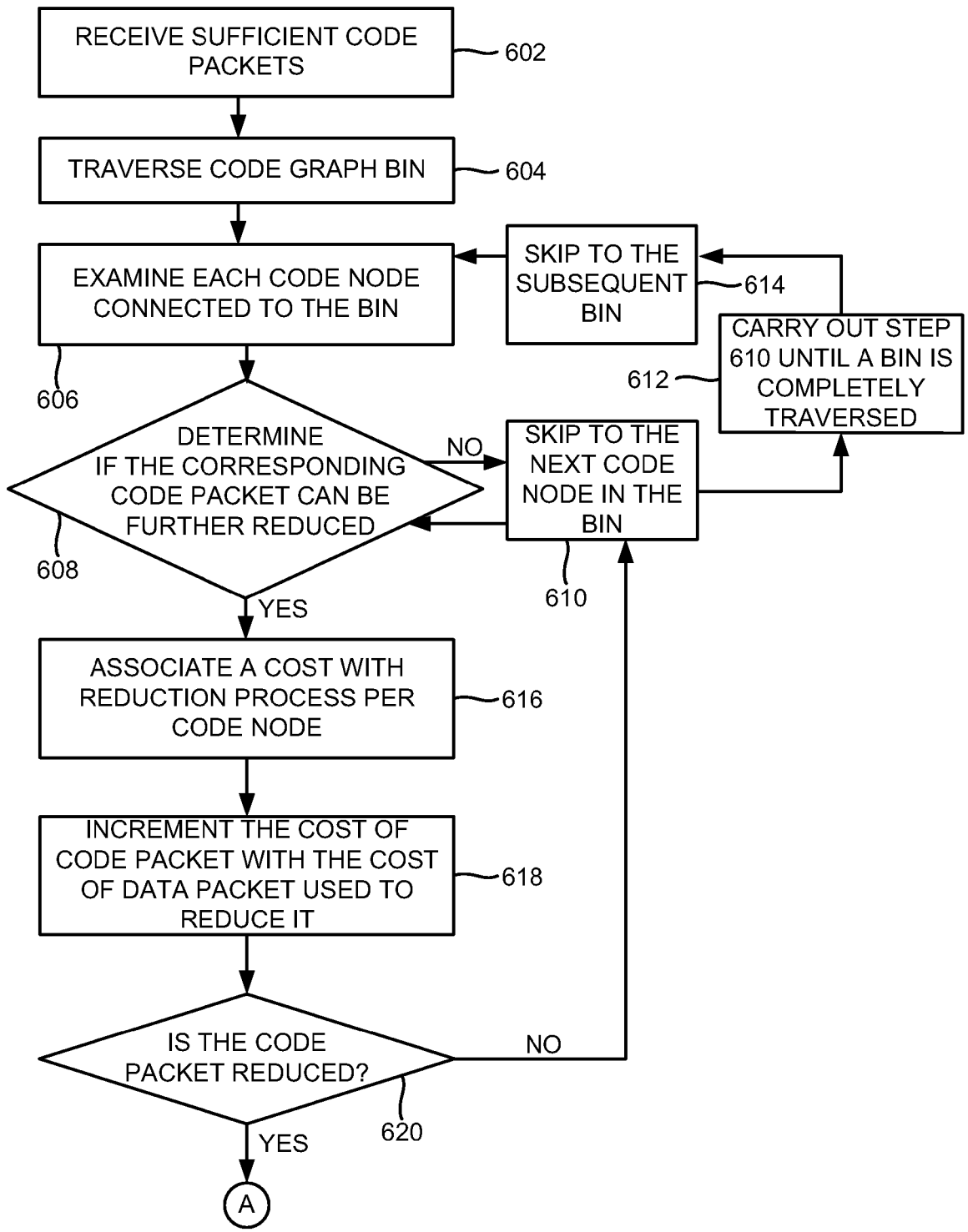
FIGS. 6A through 6C are flow diagrams illustrating a solvability algorithm according to an embodiment herein.
Figure 6B:
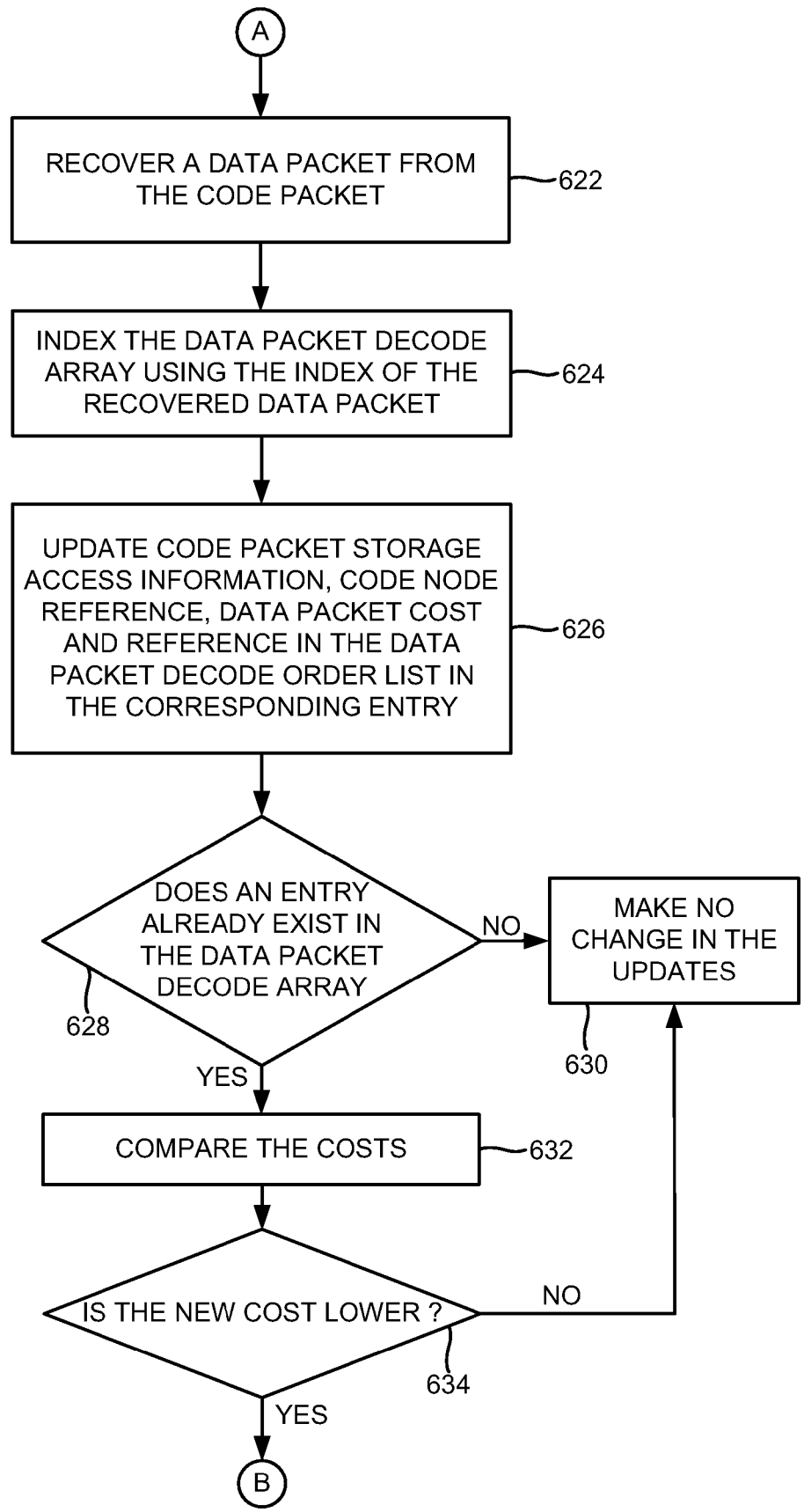
Figure 6C:
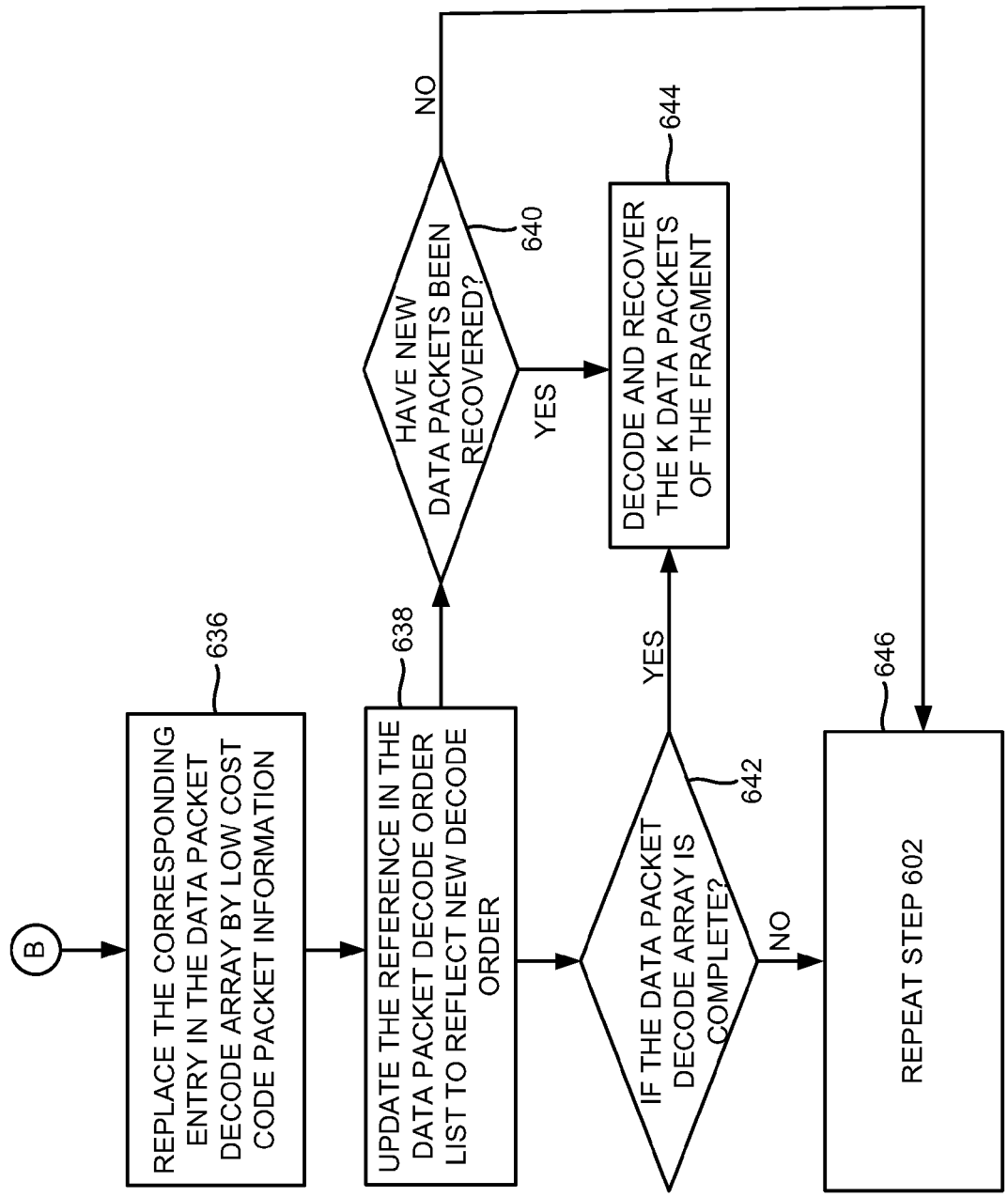

The parameter FILE_FRAGMENT_ID 506 is used to determine which file fragment the received FDP packet belongs to. The parameter FILE_DISTRIBUTION_RECORD 508 contains data such as offset of the file fragment in the file, the size of file fragment and the code weight map which contains the code weights used to encode the parity FDP code packets. FIGS. 6A through 6C is a flow diagram illustrating a solvability algorithm according to an embodiment herein. In step 602, sufficient numbers of code packets are received. In step 604, the code graph bins are traversed starting with the lowest code weight bin.

In step 606, each code node in the list connected to the bin is examined. In step 608, a condition is checked to determine if its corresponding code packet can be further reduced, such as according to a Lauritzen/Spiegelhalter Belief Propagation Algorithm. If not (No), the process moves to step 610, and the code node is skipped to the next code node in the bin. In step 612, the step 610 is carried out until a bin is completely traversed. In step 614, the subsequent bin is selected and the steps from 606 are repeated. If the code packet can be further reduced (Yes), the process proceeds to step 616, and a cost is associated with the reduction process per code node. The cost reflects the associated effort in the reduction process such as computational power and storage access time.

In step 618, the cost value of a given code packet is incremented by the value of the cost associated with the data packet used to reduce it. In one embodiment, data packets inherit the cost of the corresponding code packet used to recover them. For example the cost of a data packet is 1 when the corresponding code packet's cost is 1 which in that case is equal to the code weight w. In step 620, a condition is checked if the code packet is reduced. If the code packet is not reduced (No), it is jumped to the step 610. If the code packet is reduced (Yes), then it is jumped to step 622.

In steps 622, 624, and 626, a data packet is recovered from the code packet, if a code packets is reduced to weight w=1, the data packet decode array 200C of FIG. 2C is indexed using the index of the recovered data packet and information including code packet storage access information, code node reference, data packet cost and reference of the decode order in data packet decode order list are updated in the corresponding entry. In step 628, a condition is checked if an entry already exists in the data packet decode array. If the entry does not already exist (Yes), it is jumped to step 632. If the condition is not satisfied (No), it is jumped to the step 630. In step 630, no changes are made in the updates. In step 632, the costs are compared. In step 634, a condition is checked if the new cost is lower. If the condition is not satisfied (No), then it is jumped to step 630.

If the condition is satisfied (Yes), then it is jumped to step 636. In steps 636 and 638, the corresponding entry in the data packet decode array is replaced by the information of the code packet with lower cost and the reference in decode packet order list is updated to reflect new decode order. In step 640, a condition is checked if new data packets have been recovered. If the condition is satisfied (Yes), it is jumped to step 644. If the condition is not satisfied (No), then it is jumped to step 646. In step 642, another condition is checked if the data packet decode array is complete. If it is complete (Yes), it is jumped to step 644. If it is not complete (No), it is jumped to step 646. In step 644, the K data packets of the fragment are decoded and recovered. In step 646, the solvability algorithm is repeated from step 602.

Figure 7:
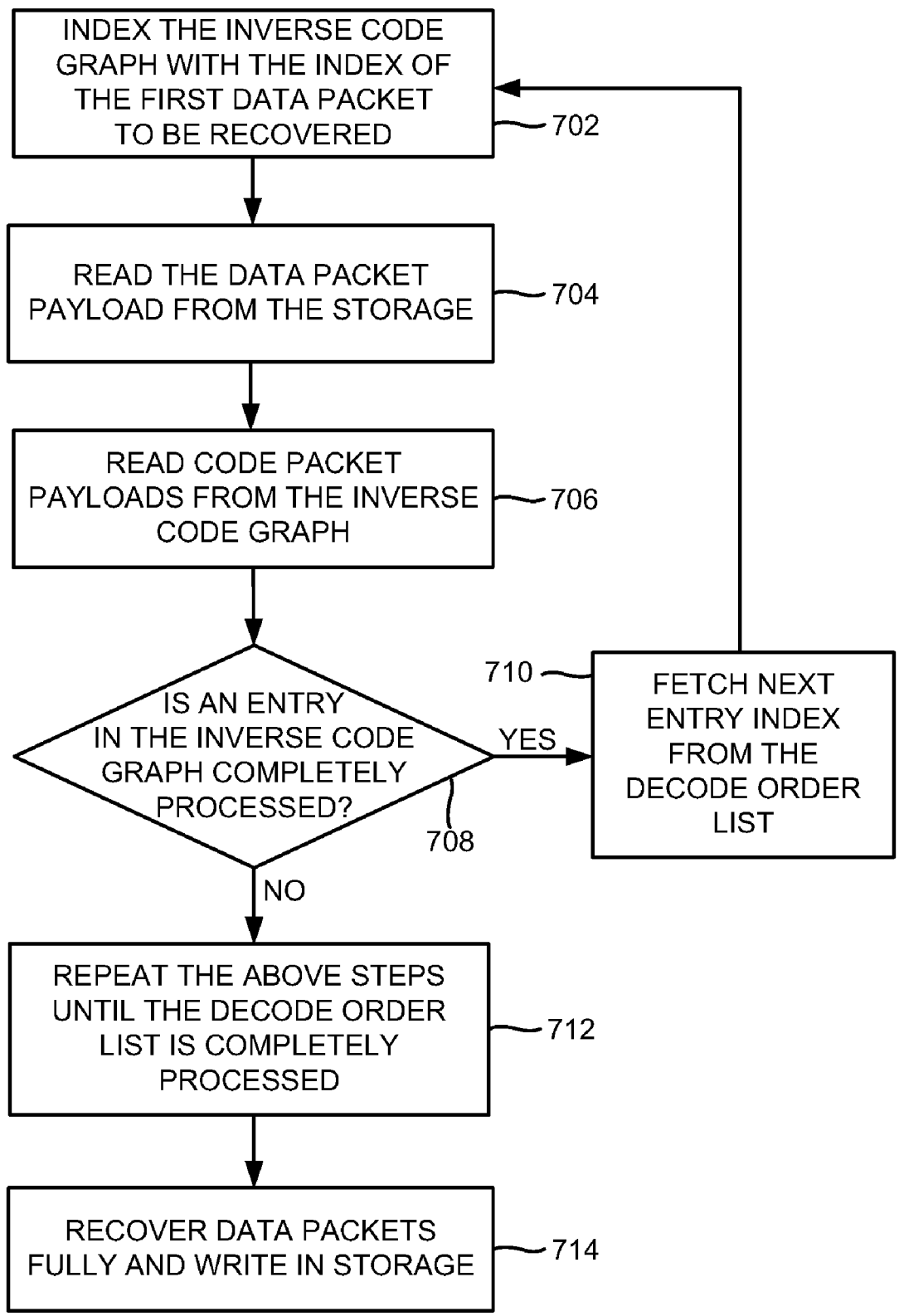
FIG. 7 is a flow diagram illustrating a process of code packets payload reduction according to an embodiment herein.

FIG. 7 is a flow diagram illustrating a process of code packet payload reduction according to an embodiment herein. In step 702, the inverse code graph is indexed with the index of the first data packet to be recovered using the data packet decode order list. In step 704, the data packet payload is read from the storage. In step 706, code packet payloads are read from the inverse code graph. In step 708, a condition is checked if an entry in the inverse code graph is completely processed and the process is jumped to step 710 if the entry in the inverse code graph is completely processed (Yes). The process is jumped to step 712, if the entry in the inverse code graph is not completely processed (No).

Figure 8:
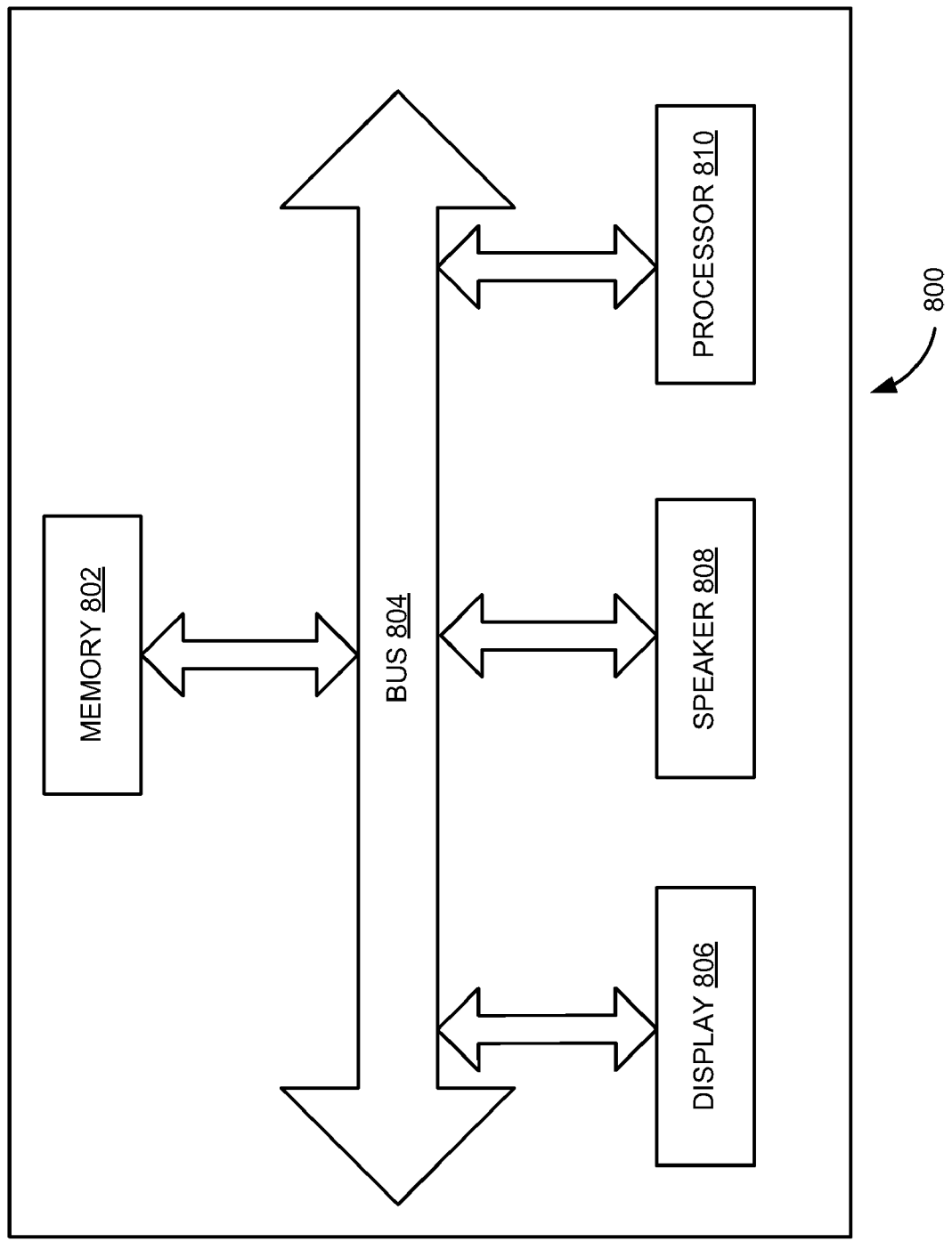
FIG. 8 illustrates an exploded view of a mobile TV receiver according to an embodiment herein.

In step 710, the next entry index is fetched from the decode order list and the process is repeated again from step 702. In step 712, the steps from 702 are repeated until the decode order list is completely processed. In step 714, data packets are fully recovered and written to storage. FIG. 8 illustrates exploded view of a mobile TV receiver 800 having a memory 802 with a computer set of instructions, a bus 804, a display 806, a speaker 808, and a processor 810 capable of processing the set of instructions to perform any one or more of the methodologies herein, according to an embodiment herein. The processor 810 may also enable frequency samples to be consumed in the form of one or more displays 806 or audio for output via speaker and/or earphones 808.

The processor 810 may also carry out the methods described herein and in accordance with the embodiments herein. The received frequency domain sample may also be stored in the memory 802 for future processing or consumption. The memory 802 may also store specific information about the frequency domain sample available in the future or stored from the past. When the sample is selected, the processor 810 may pass information. The information may be passed among functions within mobile TV receiver 800 using the bus 804.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 9:
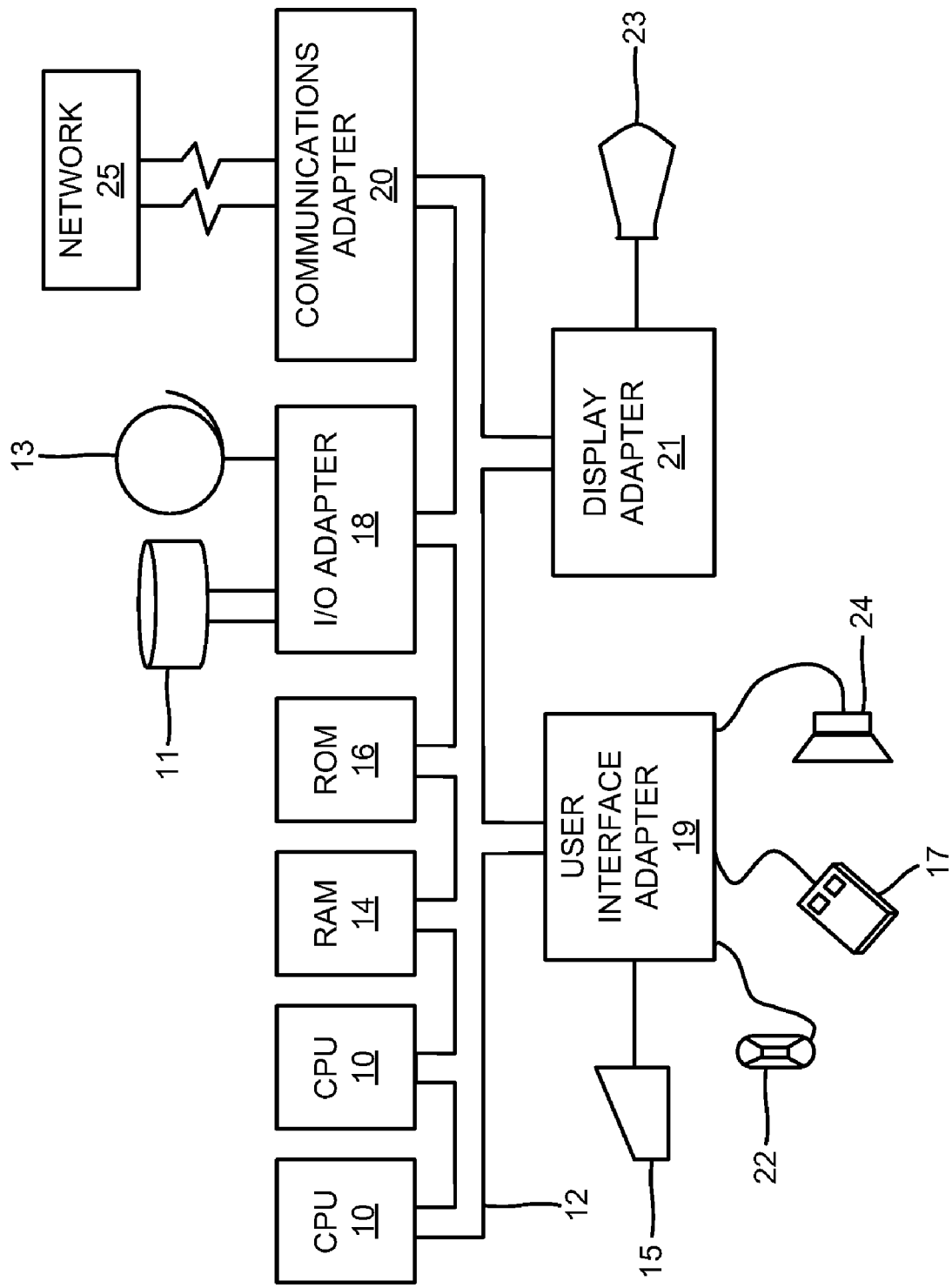
FIG. 9 illustrates a schematic diagram of a computer architecture according to an embodiment herein.

A representative hardware environment for practicing the embodiments herein is depicted in FIG. 9. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The protocols FDP and FDCP deliver file data. FDP delivers encoded packets. FDCP delivers control information related to the file delivery. The recovery process of data packets of the file fragment 102 from the code packets 106 is performed by inverting the encoding process and solving the linear system of equations. The decoding process invokes a solvability algorithm. The methods disclosed herein optimize the use of working memory, file storage access and minimize the number of steps to recover the data packets in mobile devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of decoding code packets of file delivery protocol (FDP) and file delivery control protocol (FDCP) messages, said FDP messages comprising fields having values used to generate an indices of a data packets, said FDCP messages comprising a value of a minimum number of code packets required, said code packets formed from a linear combination of said data packets of a file fragment, said method comprising:
    constructing data structures adapted to decode said code packets of said file fragment, wherein said data structures comprising at least one of code nodes, a code graph, an inverse code graph, a data packet decode array, and a data packet decode order list;
    processing said FDP messages until parameters required for decoding are extracted, wherein said processing comprising:
        inserting said code node into a code graph bin of said code graph corresponding to weights of said code graph bin only if an FDP message corresponding to said code node is unique; and
        populating said inverse code graph with a reference to said code node; and
    executing a solvability algorithm when a number of received code packets reaches said minimum number of code packets required,
    wherein said solvability algorithm comprises:
        traversing code graph bins having code nodes starting with a code graph bin having lowest code weight, wherein said code graph bins are arranged in an ascending order of code weights;
        determining if a corresponding code packet of each code node in a list connected to each of said code graph bins can be reduced further using a data packet associated with said code packet;
        proceeding to a next code node in said list only if said code packet cannot be reduced further; and
        incrementing a cost value of said code packet by a cost value associated with said data packet used to reduce said code packet.

2. The method of claim 1, wherein said code nodes are connected to each other linearly.

3. The method of claim 1, wherein said parameters required for decoding comprises at least one of:
    a minimum number of said code packets to decode successfully with high probability;
    a field in said FDP message containing specific values to generate data packet indices;
    a file fragment ID to determine which file fragment a received FDP packet belongs to; and
    a file distribution record comprising at least one of an offset of said file fragment in a file, a size of said file fragment, and a code weight map.

4. The method of claim 3, wherein said FDP message corresponding to said code node is determined to be unique based on any of: whether at least one of a data index, a code weight index, and a prime index have not been already received.

5. The method of claim 1, wherein said solvability algorithm further comprises:
    indexing said data packet decode array using an index of a recovered data packet; and
    updating a code packet storage access information, a code node reference, a data packet cost, and a reference of a decode order in said data packet decode order list, if a data packet can be recovered from said code packet.

6. The method of claim 5, wherein said solvability algorithm further comprises:
    replacing a corresponding entry in said data packet decode array by an information of a code packet from which said data packet is recovered; and
    updating said reference in said data packet decode order list to reflect a new decode order, if a cost associated with said code packet is less than a cost associated with said corresponding entry in said data packet decode array.

7. The method of claim 6, further comprising indicating a decode failure for a file reception condition if an end of a contact window is reached and no more code packets are received.

8. The method of claim 6, further comprising executing a code packet payload reduction algorithm to reduce a stored code packet payload using an information in said data packet decode array and said inverse code graph if said solvability algorithm is successful, wherein said code packet payload reduction algorithm comprises:
    indexing said inverse code graph with the index of a first data packet to be recovered using said data packet decode order list;
    obtaining a code packet payload from said inverse code graph;
    fetching a next entry index from said data packet decode order list;
    repeating said indexing of said inverse code graph with the index of a first data packet to be recovered using said data packet decode order list; and
    repeating said indexing of said inverse code graph with the index of a first data packet to be recovered using said data packet decode order list until said data packet decode order list is completely processed and all data packets have been fully recovered.

9. A computer having stored thereon data structures adapted to decode a file delivery protocol (FDP) packet of a file fragment, said data structures comprising:
    a code node to store information for retrieving a payload of said FDP packet, said code node adapted to indicate if its corresponding code packet can be further reduced;
    a code graph comprising bins corresponding to a code weight, said bins comprising code nodes with said code weight;
    an inverse code graph array having a number of elements equivalent to a number of data packets in said file fragment;

a data packet decode array adapted to check whether all said data packets can be decoded successfully;

a data packet decode order list to store an order in which said data packets are recovered; and instructions for performing a solvability algorithm when a number of received code packets reaches a minimum number of code packets required, wherein said solvability algorithm comprises:

traversing code graph bins having code nodes starting with a code graph bin having lowest code weight, wherein said code graph bins are arranged in an ascending order of code weights;

determining if a corresponding code packet of each code node in a list connected to each of said code graph bins can be reduced further using a data packet associated with said code packet;

proceeding to a next code node in said list only if said code packet cannot be reduced further; and incrementing a cost value of said code packet by a cost value associated with said data packet used to reduce said code packet.

10. The computer of claim 9, wherein said bins are arranged in order based on said code weights.

11. The computer of claim 9, wherein said inverse code graph is indexed by an index of said data packets.

12. The computer of claim 9, wherein said data packet decode array is indexed by an index of a recovered data packet, if said data packet can be recovered from said code packet, wherein said data packet decode array comprises a code packet storage access information, a code node reference, a data packet cost, and a reference of a decode order in said data packet decode order list.

13. An apparatus adapted to decode code packets of file delivery protocol (FDP) and file delivery control protocol (FDCP) messages, said FDP messages comprising fields having values used to generate an indices of a data packets, said FDCP messages comprising a value of a minimum number of code packets required, said code packets formed from a linear combination of said data packets of a file fragment, said apparatus comprising:

a memory unit comprising data structures adapted to decode said code packets of said file fragment, wherein said data structures comprising at least one of code nodes, a code graph, an inverse code graph, a data packet decode array, and a data packet decode order list;

a processor configured to:
  process said FDP messages until parameters required for decoding are extracted;
  insert said code node into a code graph bin of said code graph corresponding to weights of said code graph bin only if an FDP message corresponding to said code node is unique;
  populate said inverse code graph with a reference to said code node; and
  execute a solvability algorithm when a number of received code packets reaches said minimum number of code packets required,
  wherein said solvability algorithm comprises:
    traversing code graph bins having code nodes starting with a code graph bin having lowest code weight, wherein said code graph bins are arranged in an ascending order of code weights;
    determining if a corresponding code packet of each code node in a list connected to each of said code graph bins can be reduced further using a data packet associated with said code packet;
    proceeding to a next code node in said list only if said code packet cannot be reduced further; and
    incrementing a cost value of said code packet by a cost value associated with said data packet used to reduce said code packet.

14. The apparatus of claim 13, wherein said code nodes are connected to each other linearly.

15. The apparatus of claim 13, wherein said parameters required for decoding comprises at least one of:
  a minimum number of said code packets to decode successfully with high probability;
  a field in said FDP message containing specific values to generate data packet indices;
  a file fragment ID to determine which file fragment a received FDP packet belongs to; and
  a file distribution record comprising at least one of an offset of said file fragment in a file, a size of said file fragment, and a code weight map.

16. The apparatus of claim 15, wherein said FDP message corresponding to said code node is determined to be unique based on any of: whether at least one of a data index, a code weight index, and a prime index have not been already received.

17. The apparatus of claim 13, wherein said solvability algorithm further comprises:
  indexing said data packet decode array using an index of a recovered data packet; and
  updating a code packet storage access information, a code node reference, a data packet cost, and a reference of a decode order in said data packet decode order list, if a data packet can be recovered from said code packet.

18. The apparatus of claim 17, wherein said solvability algorithm further comprises:
  replacing a corresponding entry in said data packet decode array by an information of a code packet from which said data packet is recovered; and
  updating said reference in said data packet decode order list to reflect a new decode order, if a cost associated with said code packet is less than a cost associated with said corresponding entry in said data packet decode array.

19. The apparatus of claim 18, wherein said processor is further configured to indicate a decode failure for a file reception condition if an end of a contact window is reached and no more code packets are received.

20. The apparatus of claim 18, wherein said processor is further configured to execute a code packet payload reduction algorithm to reduce a stored code packet payload using an information in said data packet decode array and said inverse code graph if said solvability algorithm is successful, wherein said code packet payload reduction algorithm comprises:
  indexing said inverse code graph with the index of a first data packet to be recovered using said data packet decode order list;
  obtaining a code packet payload from said inverse code graph;
  fetching a next entry index from said data packet decode order list;
  repeating said indexing of said inverse code graph with the index of a first data packet to be recovered using said data packet decode order list; and
  repeating said indexing of said inverse code graph with the index of a first data packet to be recovered using said data packet decode order list until said data packet decode order list is completely processed and all data packets have been fully recovered.

* * * * *